US011345249B2

(12) United States Patent
Lee et al.

(10) Patent No.: US 11,345,249 B2
(45) Date of Patent: May 31, 2022

(54) POWER CONVERSION APPARATUS FOR MULTI-VOLTAGE CHARGING (71) Applicants: Hyundai Motor Company, Seoul (KR); Kia Motors Corporation, Seoul (KR)

(72) Inventors: Ki Jong Lee, Osan-si (KR); Sang Cheol Shin, Suwon-si (KR); Young Seul Lim, Seoul (KR); Ji Woong Jang, Hwaseong-si (KR); Yoo Jong Lee, Osan-si (KR); Jun Hwan Kim, Hwaseong-si (KR); Seong Min Lee, Hwaseong-si (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 0 days.

(21) Appl. No.: 16/996,478

(22) Filed: Aug. 18, 2020

(65) Prior Publication Data

US 2021/0178920 A1 Jun. 17, 2021

(30) Foreign Application Priority Data

Dec. 13, 2019 (KR) ........................ 10-2019-0167264

(51) Int. Cl.
| | |
|---|---|
| *B60L 53/24* | (2019.01) |
| *H02J 7/16* | (2006.01) |
| *H02J 7/00* | (2006.01) |
| *H02K 5/22* | (2006.01) |
| *H02P 27/06* | (2006.01) |
| *B60K 1/00* | (2006.01) |

(Continued)

(52) U.S. Cl.
CPC ................ *B60L 53/24* (2019.02); *B60K 1/00* (2013.01); *B60K 1/04* (2013.01); *B60L 53/302* (2019.02); *B60L 53/55* (2019.02); *H02J 7/0042* (2013.01); *H02J 7/16* (2013.01); *H02K 5/225* (2013.01); *H02K 11/33* (2016.01); *H02P 27/06* (2013.01); *H05K 7/20927* (2013.01)

(58) Field of Classification Search
CPC ...................................... B60L 53/24
See application file for complete search history.

(56) References Cited

U.S. PATENT DOCUMENTS

| | | | |
|---|---|---|---|
| 10,369,900 B1* | 8/2019 | Conlon | .................. B60L 53/14 |
| 2010/0326750 A1* | 12/2010 | Murakami | .............. B60L 58/34 |
| | | | 180/65.31 |

(Continued)

FOREIGN PATENT DOCUMENTS

| | | |
|---|---|---|
| KR | 20190010786 A | 1/2019 |
| KR | 20190119778 A | 10/2019 |

*Primary Examiner* — Daniel Kessie
(74) *Attorney, Agent, or Firm* — Slater Matsil, LLP (57) ABSTRACT A power conversion apparatus for multi-voltage charging is provided. The power conversion apparatus includes a housing, a motor connecting terminal disposed at one side of the housing, a relay having a first end electrically connected to the motor connecting terminal, and a capacitor having a first terminal electrically connected to a second end of the relay, and second and third terminals respectively connected to positive and negative terminals of an external battery, wherein the motor connecting terminal, the relay, and the first, second and third terminals are disposed within the housing along an outer edge of the housing.

20 Claims, 4 Drawing Sheets (51) Int. Cl.
  *B60K 1/04* (2019.01)
  *B60L 53/302* (2019.01)
  *B60L 53/55* (2019.01)
  *H02K 11/33* (2016.01)
  *H05K 7/20* (2006.01)

(56) References Cited

U.S. PATENT DOCUMENTS

2018/0241337 A1\* 8/2018 Zou ........................ B60L 50/51
2019/0023136 A1 1/2019 Lee et al.
2019/0315234 A1 10/2019 Shin et al.

\* cited by examiner

POWER CONVERSION APPARATUS FOR MULTI-VOLTAGE CHARGING

CROSS-REFERENCE TO RELATED APPLICATIONS

This application claims priority to Korean Patent Application No. 10-2019-0167264, filed in the Korean Intellectual Property Office on Dec. 13, 2019, which application is hereby incorporated herein by reference.

TECHNICAL FIELD

The present invention relates to a power conversion apparatus for multi-voltage charging.

BACKGROUND

Generally, an electric vehicle or a plug-in hybrid vehicle performs recharging of a battery therein by converting electric power supplied from an external recharging facility into a state suitable for battery recharging, and then supplying the converted electric power to the battery.

For example, conventional recharging facilities for quick recharging are manufactured to output a single standard voltage of 400 V. However, the recent tendency of batteries used in vehicles is to be designed to have a voltage of 800 V or more for enhancement in efficiency and increase in travelable distance. Since batteries used in vehicles have a voltage specification of 800 V or more, despite quick recharging facilities still supplying a recharging voltage of 400 V, as mentioned above, a boosting converter is demanded for boosting of the voltage supplied from an external recharging facility.

However, boosting converters having a large capacity, which are used to boost a voltage of 400 V to 800 V or more, are not only great in weight and volume, but also are expensive. For this reason, installation of such a boosting converter in a vehicle is difficult. Furthermore, the boosting converter may increase costs of the vehicle.

To this end, the applicant of the present application has proposed a technology disclosed in Korean Unexamined Patent Publication No. 10-2019-011978 as a new recharging technology capable of boosting a low recharging voltage supplied from a recharging facility to a high voltage without installation of an additional device and an additional increase in expense. The technology disclosed in the prior art literature is a scheme for boosting a low recharging voltage applied to a neutral point of a motor using an inductor provided at the motor and switching elements of an existing converter circuit, and then supplying the boosted voltage to a battery to be recharged.

The technology disclosed in the prior art literature relates to a topology of a converter circuit mainly constituted by a motor and an inverter circuit. For realization of the topology disclosed in the prior art literature through actual hardware, it is necessary to develop a power conversion apparatus having a new structure, taking into consideration connection among hardware constituent elements and electrical conduction and heat dissipation of added hardware elements.

The above matters disclosed in this section are merely for enhancement of understanding of the general background of the invention and should not be taken as an acknowledgement or any form of suggestion that the matters form the related art already known to a person skilled in the art.

SUMMARY

The present invention relates to a power conversion apparatus for multi-voltage charging. Particular embodiments relate to a power conversion apparatus for multi-voltage charging, which is capable of supplying a recharging voltage to a battery after boosting the recharging voltage using an inductor of a motor and switching elements of an inverter circuit when the recharging voltage, which is supplied to recharge the battery, is lower than a battery voltage.

Therefore, the present invention has been made in view of problems in the art, and it is an embodiment of the present invention to provide a power conversion apparatus for multi-voltage charging, which is capable of supplying a recharging voltage to a battery after boosting the recharging voltage using an inductor of a motor and switching elements of an inverter circuit when the recharging voltage, which is supplied to recharge the battery, is lower than a battery voltage.

An embodiment of the present invention provides a power conversion apparatus for multi-voltage charging including a housing, a motor connecting terminal disposed at one side of the housing, a relay electrically connected, at one end thereof, to the motor connecting terminal, and a capacitor having a first terminal electrically connected to the other end of the relay, and second and third terminals respectively connected to positive and negative terminals of an external battery, wherein the motor connecting terminal, the relay, and the first to third terminals are disposed within the housing along an outer edge of the housing.

The power conversion apparatus may further include a circuit assembly including an inverter circuit electrically connected to the motor connecting terminal, the second terminal and the third terminal, the inverter circuit including a plurality of switching elements configured to convert a DC voltage of the battery applied between the second terminal and the third terminal and then to supply the converted voltage, and a gate driving circuit configured to provide a signal for driving the plurality of switching elements.

The circuit assembly may be disposed at a central portion of an inner space of the housing. The motor connecting terminal may be disposed between a first outer edge portion of the housing and the circuit assembly. The capacitor may be disposed between a second outer edge portion of the housing facing the first outer edge portion and the circuit assembly.

The relay may be disposed between a third outer edge portion of the housing connecting the first outer edge portion and the second outer edge portion and the circuit assembly. The capacitor may be disposed such that the first to third thermals are disposed adjacent to the third outer edge portion.

The power conversion apparatus may further include a first bus bar having opposite ends respectively connected to the motor connecting terminal and one end of the relay, and a second bus bar having opposite ends respectively connected to the other end of the relay and the first terminal. Each of the first and second bus bars may have a structure extending along the outer edge of the housing.

The motor connecting terminal may include a u-phase connecting terminal, a v-phase connecting terminal, a w-phase connecting terminal and a neutral-point connecting terminal respectively connected to u-phase, v-phase, w-phase and neutral-point terminals of the motor. One end of the relay may be electrically connected to the neutral-point connecting terminal.

The power conversion apparatus may further include an insulator disposed between at least a portion of the first bus bar or at least a portion of the second bus bar and the housing. The at least a portion of the first bus bar or the at least a portion of the second bus bar may be in surface contact with a portion of the housing via the insulator.

In accordance with another aspect of the present invention, there is provided a power conversion apparatus for multi-voltage charging including a housing having an inner space inside an outer edge thereof, a neutral-point connecting terminal disposed at one side of the inner space adjacent to the outer edge while being connected to a neutral point of a motor, a first bus bar connected, at one end thereof, to the neutral-point connecting terminal while extending along the outer edge, a relay disposed adjacent to the outer edge while being connected, at one end thereof, to the other end of the first bus bar, a second bus bar connected, at one end thereof, to the other end of the relay while extending along the outer edge, and a capacitor having a first terminal connected to the other end of the second bus bar, and second and third terminals respectively connected to positive and negative terminals of an external battery, the first to third terminals being disposed adjacent to the outer edge.

The power conversion apparatus may further include a circuit assembly including an inverter circuit including a plurality of switching elements configured to convert a DC voltage of the battery applied between the second terminal and the third terminal, and a gate driving circuit configured to provide a signal for driving the plurality of switching elements.

The circuit assembly may be disposed at a central portion of the inner space of the housing. The neutral-point connecting terminal may be disposed between a first outer edge portion of the housing and the circuit assembly. The capacitor may be disposed between a second outer edge portion of the housing facing the first outer edge portion and the circuit assembly.

The relay may be disposed between a third outer edge portion of the housing connecting the first outer edge portion and the second outer edge portion and the circuit assembly. The capacitor may be disposed such that the first to third thermals are disposed adjacent to the third outer edge portion.

The power conversion apparatus may further include an insulator disposed between at least a portion of the first bus bar or at least a portion of the second bus bar and the housing. The at least a portion of the first bus bar or the at least a portion of the second bus bar may be in surface contact with a portion of the housing via the insulator.

In accordance with the power conversion apparatus for multi-voltage charging, elements added for recharging through conversion of a recharging voltage using a motor neutral point are disposed along the outer edge of the housing and, as such, it may be possible to minimize an increase in volume, as compared to conventional power conversion apparatuses which do not include such additional elements.

In addition, in accordance with the power conversion apparatus for multi-voltage charging, the bus bar connected to the relay contacts a body of the housing and, as such, heat generated from the relay may be effectively dissipated.

Effects attainable in embodiments of the present invention are not limited to the above-described effects, and other effects of embodiments of the present invention not yet described will be more clearly understood by those skilled in the art from the following detailed description.

BRIEF DESCRIPTION OF THE DRAWINGS

The above and other objects, features and other advantages of embodiments of the present invention will be more clearly understood from the following detailed description taken in conjunction with the accompanying drawings, in which.

DETAILED DESCRIPTION OF ILLUSTRATIVE EMBODIMENTS

Reference will now be made in detail to the preferred embodiments of the present invention associated with a power apparatus including an interlock, examples of which are illustrated in the accompanying drawings. Wherever possible, the same reference numbers will be used throughout the drawings to refer to the same or like parts.

Figure 1:
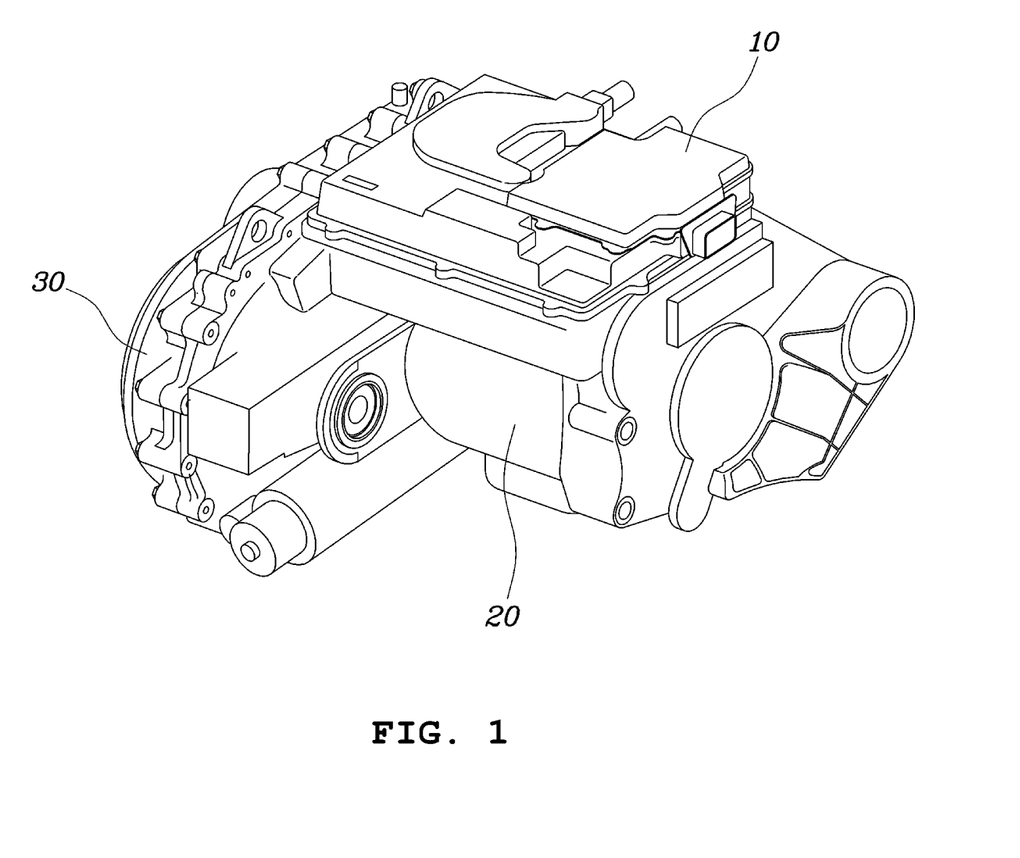
FIG. 1 is a perspective view illustrating a vehicle driving system to which a power conversion apparatus for multi-voltage charging according to an embodiment of the present invention is applied.
Figure 2:
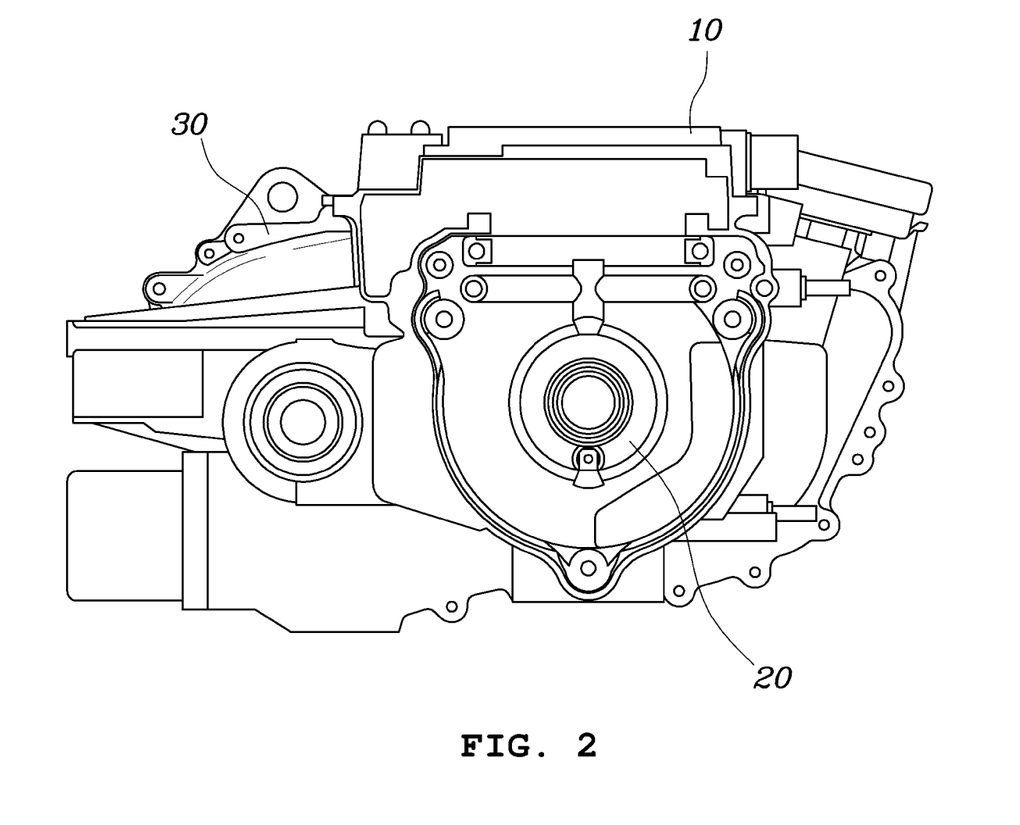
FIG. 2 is a broken view of a portion of a side surface of the power conversion apparatus for multi-voltage charging according to an embodiment of the present invention.

FIG. 1 is a perspective view illustrating a vehicle driving system to which a power conversion apparatus for multi-voltage charging according to an embodiment of the present invention is applied. FIG. 2 is a broken view of a portion of a side surface of the power conversion apparatus for multi-voltage charging according to an embodiment of the present invention.

Referring to FIGS. 1 and 2, the power conversion apparatus for multi-voltage charging according to an embodiment of the present invention, which is designated by reference numeral "10", may constitute a vehicle driving system for providing driving force to front or rear wheels of a vehicle, together with a motor 20 and a speed reducer 30.

The power conversion apparatus 10 for multi-voltage charging according to an embodiment of the present invention is disposed at a top of the motor 20, while internally forming an electrical connection to the motor 20, to supply 3-phase AC power required for driving of the motor 20 or to receive regenerative braking power output from the motor 20.

The power conversion apparatus 10 for multi-voltage charging according to an embodiment of the present invention may be a cover installed at a top of a motor housing, in which the motor 20 is installed, in the vehicle driving system. That is, elements for motor driving and multi-voltage charging may be disposed within a housing of the power conversion apparatus 10 for multi-voltage charging according to an embodiment of the present invention. In addition, the housing of the power conversion apparatus 10 for multi-voltage charging according to an embodiment of the present invention may be directed upwards, and elements fixedly disposed within the housing are directed downwards to be coupled to the motor housing.

In such a structure, the elements of the power conversion apparatus 10 for multi-voltage charging according to an embodiment of the present invention may be fastened to the motor disposed within the motor housing in a direct bus bar fastening manner without separate wiring.

Figure 3:
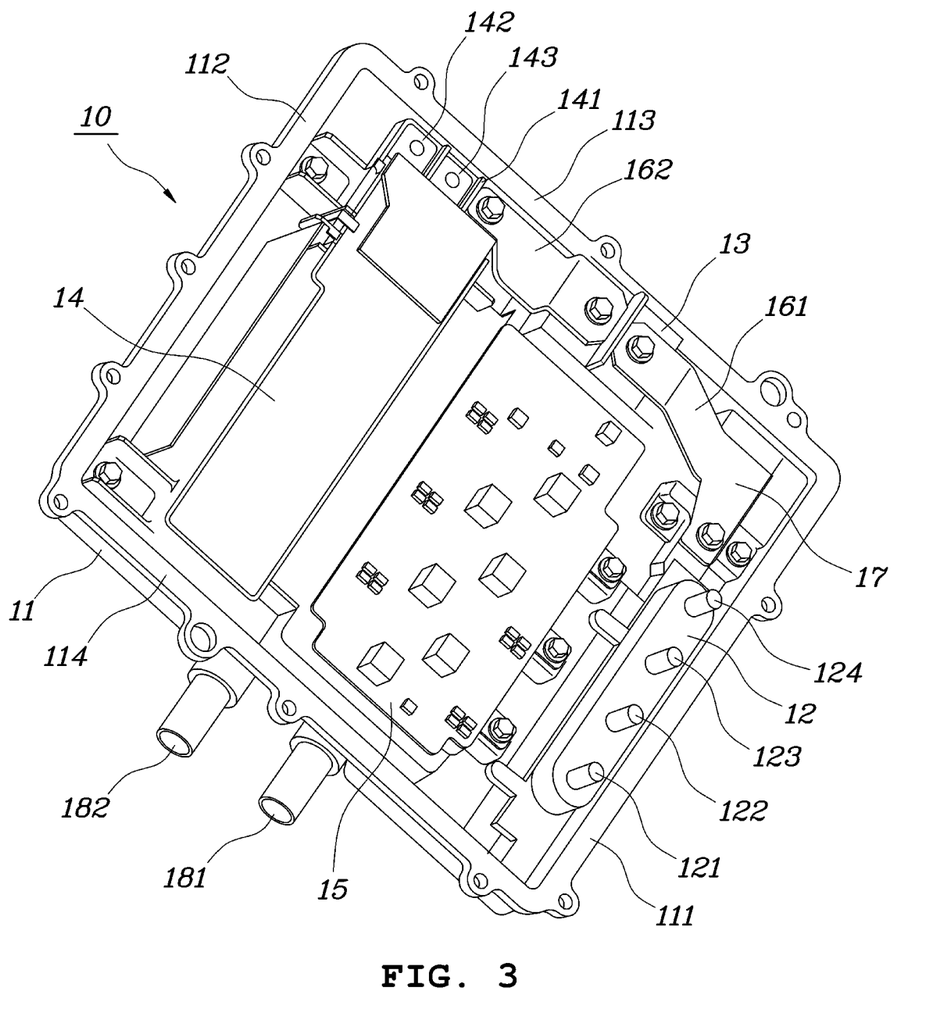
FIG. 3 is a perspective view of the power conversion apparatus for multi-voltage charging according to an embodiment of the present invention.
Figure 4:
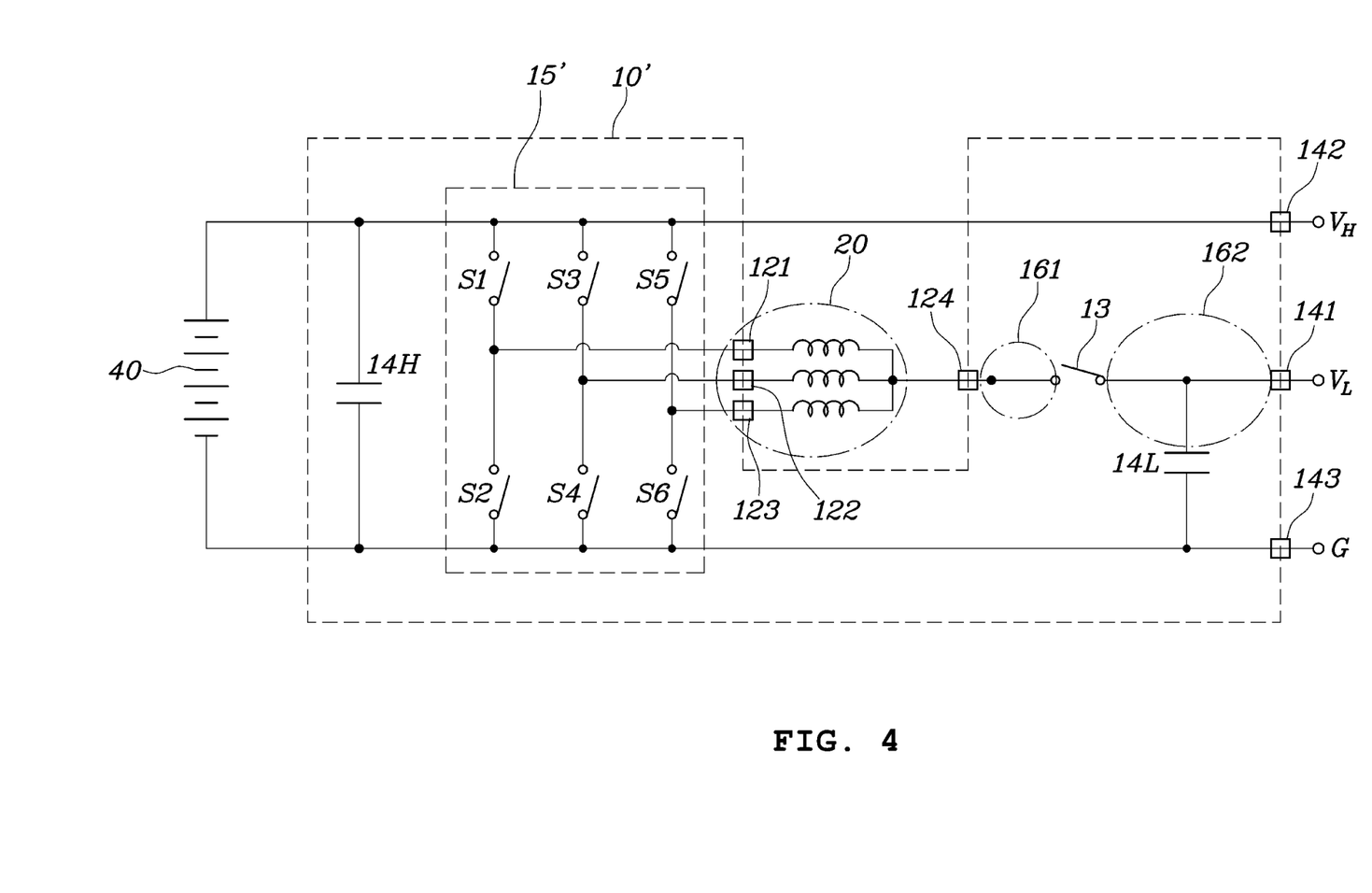
FIG. 4 is a circuit diagram illustrating a circuit configured in the power conversion apparatus for multi-voltage charging according to an embodiment of the present invention.

FIG. 3 is a perspective view of the power conversion apparatus for multi-voltage charging according to an embodiment of the present invention. FIG. 4 is a circuit diagram illustrating a circuit configured in the power conversion apparatus for multi-voltage charging according to an embodiment of the present invention.

An area designated by reference numeral "10" in FIG. 4 corresponds to the circuit configured in the power conversion apparatus for multi-voltage charging according to an embodiment of the present invention. Substantially-identical constituent elements are designated by the same reference numerals in FIGS. 3 and 4. Similar or corresponding portions of constituent elements are designated by the same reference numerals, but are distinguished from each other through selective suffix of a prime, that is, ', to the reference numerals, in order to represent high correlation therebetween. Both the hardware structure illustrated in FIG. 3 and the circuit structure illustrated in FIG. 4 may be taken into consideration for better understanding of embodiments of the present invention.

Referring to FIGS. 3 and 4, the power conversion apparatus 10 for multi-voltage charging according to the embodiment of the present invention may include a housing 11, a motor connecting terminal 12 fixedly disposed at one side of the housing 11, a relay 13 electrically connected, at one end thereof, to the motor connecting terminal 12, and a capacitor 14 having a first terminal 141 electrically connected to the other end of the relay 13, and second and third terminals 142 and 143 respectively connected to positive and negative terminals of a battery (not shown).

The housing 11 may have a structure formed with an inner space while being closed at one side thereof and opened toward the motor 20 at the other side thereof, in order to serve as a cover of the driving system, as described above. Outer edge portions 111, 112, 113 and 114 are boundaries surrounding the inner space. In the inner space, various elements, which will be described later, may be fixedly disposed.

The motor connecting terminal 12 is a terminal directly connected to each terminal of the motor 20 disposed at a lower portion of the driving system as shown in FIG. 1, to form an electrical connection. When the motor 20 is a 3-phase motor, the motor connecting terminal 12 may include a u-phase connecting terminal 121, a v-phase connecting terminal 122, a w-phase connecting terminal 123, and a neutral-point connecting terminal 124 respectively connected to u-phase, v-phase, w-phase and, neutral-point terminals of the motor 20.

Various embodiments of the present invention have a feature in that the voltage of DC power supplied to the neutral point of the motor is converted through control of an inductor of the motor and switching elements of an inverter circuit, for recharging of a battery 40. To this end, the neutral-point connecting terminal 124 may be connected to one end of the relay 13 via a bus bar 161.

The relay 13 is provided to determine an electrical connection state between the neutral point of the motor and a terminal to which a recharging voltage input is externally applied. When recharging using a converter embodied by the inductor of the motor 20 and switching elements S1 to S6 of an inverter circuit 15' is required, the electrical connection state may be controlled by an external control signal.

The other end of the relay 13 may be connected to the first terminal 141 via a second bus bar 162. The first terminal 141 may be not only one end of the capacitor 14, but also a terminal to which a recharging voltage VL is externally applied.

In addition to the first terminal 141, the capacitor 14 may include the second terminal 142 connected to a positive terminal of the battery 40, and the third terminal 143 connected to a negative terminal of the battery 40. The capacitor 14 may be understood as a concept including a low-voltage capacitor 14L to which a relatively-low recharging voltage is applied, and a high-voltage capacitor 14H to which a relatively-high recharging voltage is applied.

When a high voltage having a sufficient level to recharge the battery 40 is applied between the second terminal 142 and the third terminal 143 from an external recharging facility, the relay 13 becomes an opened state and, as such, the battery 40 may be recharged. On the other hand, when a voltage having a lower level than the voltage of the battery 40 is applied between the second terminal 142 and the third terminal 143 as a recharging voltage, the relay 13 is short-circuited. In this state, a boosting converter constituted by the inductor of the motor 20 and the switching elements S1 to S6 of the inverter circuit 15' operates in accordance with an external control signal to convert the voltage applied between the first terminal 141 and the third terminal 143 into a level capable of recharging the battery 40. As such, the battery 40 may be recharged. When a recharging voltage is applied to the first terminal 141, or the motor 20 is driven, the second terminal 142 may become a floating state in which electrical connection to the second terminal 142 is prevented by an external relay (not shown).

An embodiment of the present invention has a feature in that the motor connecting terminal 12, the relay 13, and the first to third terminals 141 to 143 are arranged along the outer edge portions 111 and 113 of the housing 11 in order to enhance efficiency of arrangement of each constituted element in the power conversion apparatus 10. In addition to such an arrangement, the first bus bar 161 and the second bus bar 162, which electrically connect associated elements, may also be arranged along the outer edge portions 111 and 113.

In more detail, in an embodiment of the present invention, a circuit assembly 15 may be disposed at a central portion of the inner space of the housing 11. In addition, the motor connecting terminal 12 may be disposed between the first outer edge portion 111 of the housing 11 and the circuit assembly 15, whereas the capacitor 14 may be disposed between the second outer edge portion 112 of the housing 11 facing the first outer edge portion in and the circuit assembly 15. Furthermore, the relay 13 may be disposed between the third outer edge portion 113 of the housing 11 connecting the first outer edge portion in and the second outer edge portion 112 and the circuit assembly 15. The capacitor 14 may be disposed such that the first to third thermals 141 to 143 are disposed adjacent to the third outer edge portion 113.

In this case, the circuit assembly 15 may include a gate driving circuit configured to drive the inverter circuit 15' shown in FIG. 4 and the switching elements S1 to S6 in the inverter circuit 15'. As shown in FIG. 4, the inverter circuit 15' may be electrically connected to the second terminal 142 and the third terminal 143, converts a DC voltage of the battery 40 applied between the second terminal 142 and the third terminal 143, and supplies the converted voltage to the motor 20. To this end, the inverter circuit 15' may be electrically connected to the u-phase connecting terminal 121, the v-phase connecting terminal 122 and the w-phase connecting terminal 123.

As is apparent from the above description, in the power conversion apparatus 10 for multi-voltage charging according to an embodiment of the present invention, elements required for recharging through conversion of a recharging voltage using a motor neutral point are disposed along the outer edge of the housing 11 and, as such, it may be possible to minimize an increase in volume, as compared to conventional power conversion apparatuses which do not include the additional elements as described above.

In particular, in an embodiment of the present invention, a portion of the first bus bar 161 connecting the neutral-point connecting terminal 124 and one end of the relay 13 may contact the housing 11. Of course, since the housing 11 is embodied mainly using a metal material having conductivity, the power conversion apparatus 10 for multi-voltage charging according to an embodiment of the present invention may additionally include an insulating layer 17 disposed between the first bus bar 161 and the housing 11, for electrical insulation.

Through the above-described structure, heat generated from the relay 13 may be transferred to the housing 11 via the first bus bar 161 and, as such, may be efficiently dissipated. In particular, the housing 11 may be provided with a water cooling channel in order to effectively dissipate heat generated from a power module corresponding to the switching elements constituting the inverter circuit 15' and the capacitor 14. That is, the housing 11 may include a cooling channel, in which cooling water may flow, and an inlet 181 and an outlet 182 for introduction and discharge of the cooling water. Accordingly, a heat dissipation effect obtained as the bus bar contacts the body of the housing 11 may be further enhanced. In particular, when the bus bar contacts an area corresponding to the cooling channel in which cooling water flows, a further enhanced heat dissipation effect may be expected. Of course, any one of the first bus bar 161 and the second bus bar 162 may be the bus bar contacting the housing body. As the contact area increases, the heat dissipation effect may be further enhanced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A power conversion apparatus for multi-voltage charging, the power conversion apparatus comprising:
    a housing;
    a motor connecting terminal disposed at one side of the housing;
    a relay having a first end electrically connected to the motor connecting terminal;
    a capacitor having a first terminal electrically connected to a second end of the relay and second and third terminals respectively connected to positive and negative terminals of an external battery; and
    a circuit assembly comprising an inverter circuit electrically connected to the motor connecting terminal, the second terminal and the third terminal;
    wherein the motor connecting terminal, the relay, and the first, second and third terminals are disposed within the housing along an outer edge of the housing;
    wherein the circuit assembly is disposed at a central portion of an inner space of the housing;
    wherein the motor connecting terminal is disposed between a first outer edge portion of the housing and the circuit assembly; and
    wherein the capacitor is disposed between a second outer edge portion of the housing facing the first outer edge portion and the circuit assembly.

2. The power conversion apparatus according to claim 1, wherein the inverter circuit comprises:
    a plurality of switching elements configured to convert a DC voltage of the external battery applied between the second terminal and the third terminal and then to supply the converted voltage; and
    a gate driving circuit configured to provide a signal for driving the plurality of switching elements.

3. The power conversion apparatus according to claim 1, wherein the relay is disposed between a third outer edge portion of the housing connecting the first outer edge portion and the second outer edge portion and the circuit assembly.

4. The power conversion apparatus according to claim 3, wherein the capacitor is disposed such that the first, second and third terminals are disposed adjacent to the third outer edge portion.

5. The power conversion apparatus according to claim 1, further comprising:
    a first bus bar having opposite ends respectively connected to the motor connecting terminal and one end of the relay, the one end being the first end or the second end; and
    a second bus bar having opposite ends respectively connected to the other end of the relay and the first terminal, the other end being the other of the first end or the second end, wherein each of the first and second bus bars has a structure extending along the outer edge of the housing.

6. The power conversion apparatus according to claim 5, further comprising:
    an insulator disposed between at least a portion of the first bus bar or at least a portion of the second bus bar and the housing,
    wherein the at least a portion of the first bus bar or the at least a portion of the second bus bar is in surface contact with a portion of the housing via the insulator.

7. The power conversion apparatus according to claim 1, wherein:
    the motor connecting terminal comprises a u-phase connecting terminal, a v-phase connecting terminal, a w-phase connecting terminal and a neutral-point connecting terminal respectively connected to u-phase, v-phase, w-phase and neutral-point terminals of a motor; and
    one end of the relay is electrically connected to the neutral-point connecting terminal, the one end being the first end or the second end.

8. A power conversion apparatus for multi-voltage charging, the power conversion apparatus comprising:
    a housing having an inner space inside an outer edge thereof;
    a neutral-point connecting terminal disposed at one side of the inner space adjacent to the outer edge while being connected to a neutral point of a motor;
    a first bus bar having a first end connected to the neutral-point connecting terminal while extending along the outer edge;
    a relay disposed adjacent to the outer edge and having a first end connected to a second end of the first bus bar;
    a second bus bar having a first end connected to a second end of the relay while extending along the outer edge; and
    a capacitor having a first terminal connected to a second end of the second bus bar, and second and third terminals respectively connected to positive and negative terminals of an external battery, the first, second and third terminals being disposed adjacent to the outer edge.

9. The power conversion apparatus according to claim 8, further comprising a circuit assembly comprising an inverter circuit, the inverter circuit comprising:
a plurality of switching elements configured to convert a DC voltage of the external battery applied between the second terminal and the third terminal; and
a gate driving circuit configured to provide a signal for driving the plurality of switching elements.

10. The power conversion apparatus according to claim 9, wherein:
the circuit assembly is disposed at a central portion of the inner space of the housing;
the neutral-point connecting terminal is disposed between a first outer edge portion of the housing and the circuit assembly; and
the capacitor is disposed between a second outer edge portion of the housing facing the first outer edge portion and the circuit assembly.

11. The power conversion apparatus according to claim 10, wherein:
the relay is disposed between a third outer edge portion of the housing connecting the first outer edge portion and the second outer edge portion and the circuit assembly; and
the capacitor is disposed such that the first, second and third terminals are disposed adjacent to the third outer edge portion.

12. The power conversion apparatus according to claim 8, further comprising:
an insulator disposed between at least a portion of the first bus bar or at least a portion of the second bus bar and the housing,
wherein the at least a portion of the first bus bar or the at least a portion of the second bus bar is in surface contact with a portion of the housing via the insulator.

13. A vehicle comprising:
a speed reducer;
a motor;
a battery having positive and negative terminals; and
a power conversion apparatus disposed at a top of the motor, the power conversion apparatus comprising:
a housing;
a motor connecting terminal disposed at one side of the housing;
a relay having a first end electrically connected to the motor connecting terminal;
a capacitor having a first terminal electrically connected to a second end of the relay, and second and third terminals respectively connected to the positive and negative terminals of the battery; and
a circuit assembly comprising an inverter circuit electrically connected to the motor connecting terminal, the second terminal and the third terminal,
wherein the motor connecting terminal, the relay, and the first, second and third terminals are disposed within the housing along an outer edge of the housing,
wherein the circuit assembly is disposed at a central portion of an inner space of the housing;
wherein the motor connecting terminal is disposed between a first outer edge portion of the housing and the circuit assembly; and
wherein the capacitor is disposed between a second outer edge portion of the housing facing the first outer edge portion and the circuit assembly.

14. The vehicle according to claim 13, wherein the inverter circuit comprises:
a plurality of switching elements configured to convert a DC voltage of the battery applied between the second terminal and the third terminal and then to supply the converted voltage; and
a gate driving circuit configured to provide a signal for driving the plurality of switching elements.

15. The vehicle according to claim 13, wherein the relay is disposed between a third outer edge portion of the housing connecting the first outer edge portion and the second outer edge portion and the circuit assembly.

16. The vehicle according to claim 15, wherein the capacitor is disposed such that the first, second and third terminals are disposed adjacent to the third outer edge portion.

17. The vehicle according to claim 13, wherein the power conversion apparatus further comprises:
a first bus bar having opposite ends respectively connected to the motor connecting terminal and one end of the relay, the one end of the relay being the first end or the second end; and
a second bus bar having opposite ends respectively connected to the other end of the relay and the first terminal, the other end of the relay being the other of the first end or the second end, wherein each of the first and second bus bars has a structure extending along the outer edge of the housing.

18. The vehicle according to claim 17, wherein the power conversion apparatus further comprises:
an insulator disposed between at least a portion of the first bus bar or at least a portion of the second bus bar and the housing,
wherein the at least a portion of the first bus bar or the at least a portion of the second bus bar is in surface contact with a portion of the housing via the insulator.

19. The vehicle according to claim 13, wherein:
the motor connecting terminal comprises a u-phase connecting terminal, a v-phase connecting terminal, a w-phase connecting terminal and a neutral-point connecting terminal respectively connected to u-phase, v-phase, w-phase and neutral-point terminals of the motor; and
one end of the relay is electrically connected to the neutral-point connecting terminal, the one end of the relay being the first end or the second end.

20. The vehicle according to claim 13, wherein the housing of the power conversion apparatus further comprises:
a cooling channel;
an inlet for introduction of cooling water into the cooling channel; and
an outlet for discharge of the cooling water from the cooling channel.

* * * * *